United States Patent [19]
Smith

[11] Patent Number: 5,995,818
[45] Date of Patent: Nov. 30, 1999

[54] LOW NOISE BLOCK DOWNCONVERTER

[75] Inventor: Duncan M. Smith, Torrance, Calif.

[73] Assignee: TRW Inc., Redondo Beach, Calif.

[21] Appl. No.: 08/688,596

[22] Filed: Jul. 30, 1996

[51] Int. Cl.$^6$ .................................................. H04B 1/10
[52] U.S. Cl. .......................................... 455/302; 455/307
[58] Field of Search ..................................... 455/302, 307,
455/318, 319, 323, 333, 327, 339, 303,
337, 6.3, 6.2, 3.2; 348/10, 11, 7, 12, 13

[56] References Cited

U.S. PATENT DOCUMENTS

| | | | |
|---|---|---|---|
| 4,287,602 | 9/1981 | Kessler . | |
| 4,488,130 | 12/1984 | Young et al. | 333/203 |
| 4,563,773 | 1/1986 | Dixon, Jr. et al. | 455/327 |
| 4,654,885 | 3/1987 | Meszko et al. . | |
| 4,691,376 | 9/1987 | Watanabe et al. | 455/131 |
| 4,696,055 | 9/1987 | Marshall . | |
| 4,723,318 | 2/1988 | Marshall . | |
| 4,754,465 | 6/1988 | Trimble | 455/3.2 |
| 4,876,737 | 10/1989 | Woodworth et al. . | |
| 4,876,739 | 10/1989 | Ma et al. . | |
| 4,914,408 | 4/1990 | Voorman . | |
| 5,017,897 | 5/1991 | Ooi et al. | 455/327 |
| 5,027,430 | 6/1991 | Yamauchi et al. | 455/296 |
| 5,060,297 | 10/1991 | Ma et al. . | |
| 5,119,509 | 6/1992 | Kang . | |
| 5,125,109 | 6/1992 | Geller et al. | 455/327 |
| 5,125,110 | 6/1992 | Nusair | 455/327 |
| 5,142,698 | 8/1992 | Koga et al. | 455/327 |
| 5,263,182 | 11/1993 | Park . | |
| 5,263,187 | 11/1993 | Sugawa et al. | 455/302 |
| 5,276,904 | 1/1994 | Mutzig et al. | 455/3.2 |
| 5,303,403 | 4/1994 | Leong . | |
| 5,319,329 | 6/1994 | Shiau et al. . | |
| 5,323,064 | 6/1994 | Bacon et al. | 455/333 |
| 5,323,332 | 6/1994 | Smith et al. . | |
| 5,325,401 | 6/1994 | Halik et al. . | |
| 5,345,591 | 9/1994 | Tsurumaki et al. . | |
| 5,369,793 | 11/1994 | Vincent . | |
| 5,428,837 | 6/1995 | Bayruns et al. | 455/333 |
| 5,437,051 | 7/1995 | Oto | 455/3.2 |
| 5,465,420 | 11/1995 | Dougherty et al. | 455/333 |
| 5,493,303 | 2/1996 | Kolak | 455/327 |
| 5,528,769 | 6/1996 | Berenz et al. | 455/333 |
| 5,548,813 | 8/1996 | Charas et al. | 455/562 |
| 5,575,001 | 11/1996 | Ku | 455/302 |
| 5,583,891 | 12/1996 | Espe et al. | 455/303 |
| 5,584,064 | 12/1996 | Nakamura | 455/3.2 |
| 5,630,225 | 5/1997 | Corman | 455/302 |

FOREIGN PATENT DOCUMENTS

| | | |
|---|---|---|
| 0523770 | 1/1993 | European Pat. Off. . |
| 0683561 | 11/1995 | European Pat. Off. . |

OTHER PUBLICATIONS

Wallace et al., A low cost high performance MMIC low noise downconverter for direct broadcast satellite reception, IEEE 1990 Microwave and Millimeter–WAve Monolithic Circuits Symposium, pp. 7–10, Jun. 1988.

*Primary Examiner*—Reinhard J. Eisenzopf
*Assistant Examiner*—Marsha D. Banks-Harold
*Attorney, Agent, or Firm*—Michael S. Yatsko

[57] ABSTRACT

A small elliptic high pass filter is incorporated into a low noise block downconverter (LNB) to reject image frequencies in a 12 GHz Direct home satellite television Broadcasting System (DBS). A waveguide transition with separate electric probes receives Ku-band satellite signals and transmits the signals to low noise amplifiers (LNAs), a power combiner, an elliptic high pass filter, and a HEMT MMIC receiver. Within the HEMT MMIC receiver, the signal is passed through an RF amplifier stage. A mixer mixes the signal from the RF amplifier stage with a local oscillator signal to produce an intermediate frequency (IF). An IF amplifier stage amplifies the IF signal which is further processed by a television decoder box. Due to the unique response of the elliptic high pass filter, the elliptic high pass filter provides a superior image rejection with lower insertion loss for the LNB, and therefore provides improved television reception quality.

18 Claims, 3 Drawing Sheets

LOW NOISE BLOCK DOWNCONVERTER

BACKGROUND OF THE INVENTION

1. Technical Field

The present invention relates generally to electronic filters and more particularly to low noise block downconverters.

2. Discussion

Low noise block downconverters are used throughout a variety of electronic system designs to receive communication signals. Typical applications of low noise block downconverters include but are not limited to Very Small Aperture satellite Terminals (VSAT), portable satellite telephone communications terminals, point-to-point terrestrial digital radio data links, point-to-multi-point television and data broadcast transmission systems, and Direct home satellite television Broadcast Systems (DBS).

Direct home satellite television Broadcasting Systems (DBS) provide a relatively new class of television services which allows households to receive television programming directly from satellites via small satellite dishes. The size of the satellite dishes for the DBS is much smaller than its predecessors. DBS satellite dishes range from 18 inches to 3 feet in diameter, whereas predecessors typically were as large as 8 to 12 feet in diameter. The DBS satellite dishes are not moveable but instead are aimed at one position in the sky. Since the signals are digitally compressed, approximately 200 channels can currently be received by a single DBS satellite dish. The DBS satellite dish because of its smaller size can be bolted directly to the top of a home. A communications line allows the satellite dish to send processed satellite signals to a decoder box which is located inside the house.

With competition for providing DBS services to customers increasing due to their popularity, the need exists to provide a better quality signal to customers' television sets in order to continually meet customers' expectations. Also to be more commercially competitive, manufacturing costs for DBS components such as low noise block downconverters need to be minimized.

Low noise block downconverters (LNBs) are part of the 12 GHz DBS services home receiving system. Previous LNB approaches used either edge coupled or interdigitated band pass filters (BPFs). However, both of these types of band pass filters have disadvantages with respect to size, manufacturing cost, and LNB noise figure. Noise figure is the primary measurement of LNB system sensitivity to received signals, and an improved noise figure improves the quality of the signal received by the user.

SUMMARY OF THE INVENTION

According to the present invention, there is provided a low noise block downconverter used in a satellite receiving system for rejecting image frequencies from frequency modulated signals received from an antenna. The present invention uses a first low noise amplification stage having at least one low noise amplifier coupled to the antenna for low noise-amplifying of the received frequency modulated signals. A high pass elliptic filter coupled to the first low noise amplification stage passes high pass frequency signals while rejecting the image frequencies from the received frequency modulated signals. A local oscillator generates local oscillation signals at a predefined frequency. A mixer coupled to the local oscillator and to the high pass elliptic filter mixes the local oscillation signals and the high pass frequency signals from the elliptic filter to generate intermediate frequency signals. A similar system could be constructed using a low pass elliptic filter if the desired signal was below the local oscillator frequency.

BRIEF DESCRIPTION OF THE DRAWINGS

Additional advantages and features of the present invention will become apparent from the subsequent description in the appended claims, taken in conjunction with the accompanying drawings in which:

DETAILED DESCRIPTION OF THE PREFERRED EMBODIMENT

Figure 1:
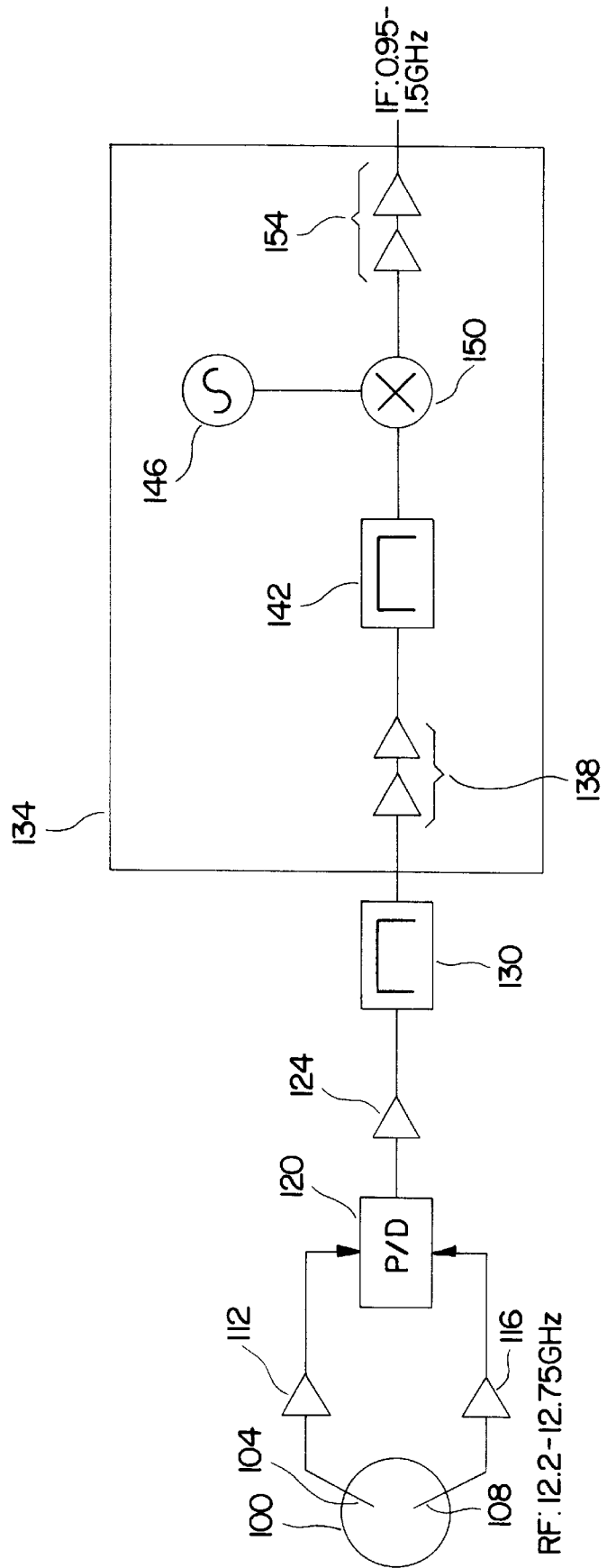
FIG. 1 shows a block diagram depicting a low noise block downconverter system for use in a Direct home satellite television Broadcasting System.

Referring now to FIG. 1, a Ku-band satellite-broadcasting signal of 12.2–12.75 GHz is received by a satellite dish antenna 98 which contains a waveguide transition 100. The signals are reflected into the waveguide transition 100 by the satellite dish antenna 98 whereupon a first electric plane probe 104 and a second electric plane probe 108 receive the signal from the waveguide transition 100. From the probes, the signal is transmitted into a microstrip circuitry to a first low noise amplifier 112 and to a second low noise amplifier 116. The first and second low noise amplifier blocks 112 and 116 form the first low noise amplifier (LNA) stage and amplify the incoming signal whose frequency is 12.2–12.75 GHz. The two separate channels of the first and second low noise amplifiers (112 and 116) result from the satellite broadcast signal containing two polarities in order to use the same frequency twice. The two polarities provide twice the number of television channels to the home. Polarizing the signals allows one of the electric plane probes to process one polarized portion of the signal while the other electric plane probe processes the other polarized portion of the signal. In the art of electronic signal processing polarization of signals can be achieved by using linear or circular polarization. Circular polarized signals are referred to as right-hand and left-hand polarization, and linear polarized signals are referred to as vertical and horizontal polarization. The waveguide transition 100 separates the incoming signals into vertical and horizontal signals as received by the electric plane probes 104 and 108.

After being amplified by the first LNA stage, the vertical and horizontal signals enter a power combiner 120 along physically separate paths. The power combiner 120 produces a desired distribution of power at the branch point by providing a switching capability between the vertical and horizontal polarized signals.

The signals coming from the power combiner 120 enter a second stage of low noise amplification (LNA 124). The signals having been amplified by the LNA 124 are then filtered by an elliptic high pass filter 130 to reject undesirable image frequencies of approximately 10.25 GHz which are present in the received radio spectrum. The elliptic high pass filter 130 provides the needed amount of image rejection with lower insertion loss than the other types of filters used in the low noise block downconverting industry. This lower insertion loss improves the overall LNB noise figure.

The elliptic filter 130 can be constructed with a variety of methods including but not limited to cavity type resonators, coaxial type resonators, or microstrip type resonators. The typical type of construction used in LNBs is a microstrip type construction where resonant stubs and coupling networks are etched on a circuit board. The patterns etched being different for each frequency of application. Elliptic filters offer a much higher rate of change between maximum attenuation and minimum attenuation than do traditional Butterworth or Chebyschev filter realizations. The superior performance of an elliptic filter function is obtained by synthesizing a microwave filter structure that places transmission zeroes at real frequencies lying on either side of the center frequency. The resulting response results in a filter that highly attenuates a set of frequencies very near to the set of frequencies that are passed with little attenuation.

The filtered signals from the elliptic high pass filter 130 enter a high electron mobility transistor monolithic microwave/millimeter wave integrated circuit downconverter (HEMT MMIC downconverter 134). The preferred embodiment of the present invention uses the elliptic high pass filter 130 as a precursory filtering stage for signals entering the HEMT MMIC downconverter 134. However, it is to be understood that the present invention is not limited to only a HEMT MMIC downconverter but also includes other types of downconverters. These other type of downconverters include metal semiconductor field-effect transistor (MESFET) MMIC, discrete component implementations, and silicon-implemented components. One example of an elliptic filter is disclosed in commonly assigned U.S. Pat. No. 5,319,329, which is hereby incorporated by reference.

Specifically within the HEMT MMIC downconverter 134, a two stage radio-frequency amplifier stage (RF amplifier stage 138) receives the signal from the elliptic high pass filter. The signal is then further filtered by a band pass filter 142. A local oscillator 146 generates a signal at a frequency about 11.25 GHz. An active dual-gate mixer 150 receives both the 11.25 GHz signal from the local oscillator 146 and the signal from the band pass filter 142. The mixer 150 produces an intermediate frequency (IF) signal which is further amplified by a two stage intermediate frequency amplifier 154. The output IF signal from the two stage intermediate frequency amplifier 154 is at a frequency of 0.95–1.5 GHz.

Within the DBS, the output IF signal is transmitted to a decoder box which is connected to a customer's television set. Since the information of the satellite broadcasted signal was compressed for more efficient transmission, the decoder box decompresses the information of the IF signal before passing the signal to a customer's television.

It should be understood that the present invention may encompass frequencies different than that provided in the preferred embodiment since many different frequencies operate in the DBS environment. In fact, it should be further understood that the present invention includes those devices which receive radio frequencies whether operating in a DBS environment or in some other capacity such as in a VSAT System.

Given this overview, the specific function of the elliptic high pass filter 130 within the DBS environment is more readily apparent. As noted above, the satellite broadcast signals range from 12.2–12.75 GHz and the local oscillator generates 11.25 GHz signals. Also operating at approximately the same frequency of the image band frequency is a military radar band. The military radar band operates at a frequency of approximately 10 GHz. Consequently, if the military radar band signals were to enter the HEMT MMIC downconverter, these signals would disrupt the television reception. Additionally, the image band frequency contains noise which, if combined through the mixing process of mixer 150 into the IF signal, also would seriously degrade television reception. Accordingly, the elliptic high pass filter 130 is introduced to reject the image frequencies of approximately 10.25 GHz which are approximately one GHz below the local oscillator frequency of 11.25 GHz.

Furthermore, the elliptic high pass filter 130 is substantially smaller than other types of filters. This smaller size reduces the manufacturing costs due to the less material required to build the elliptic high pass filter 130.

The filter response from the elliptic type filter provides optimum filter size and minimum insertion loss for a given required out-of-band rejection by making use of finite transmission zeros on each side of the pass band. Also, the minimum insertion loss improves system noise figure, therefore increasing the quality of the signal provided to a television set.

Figure 2:
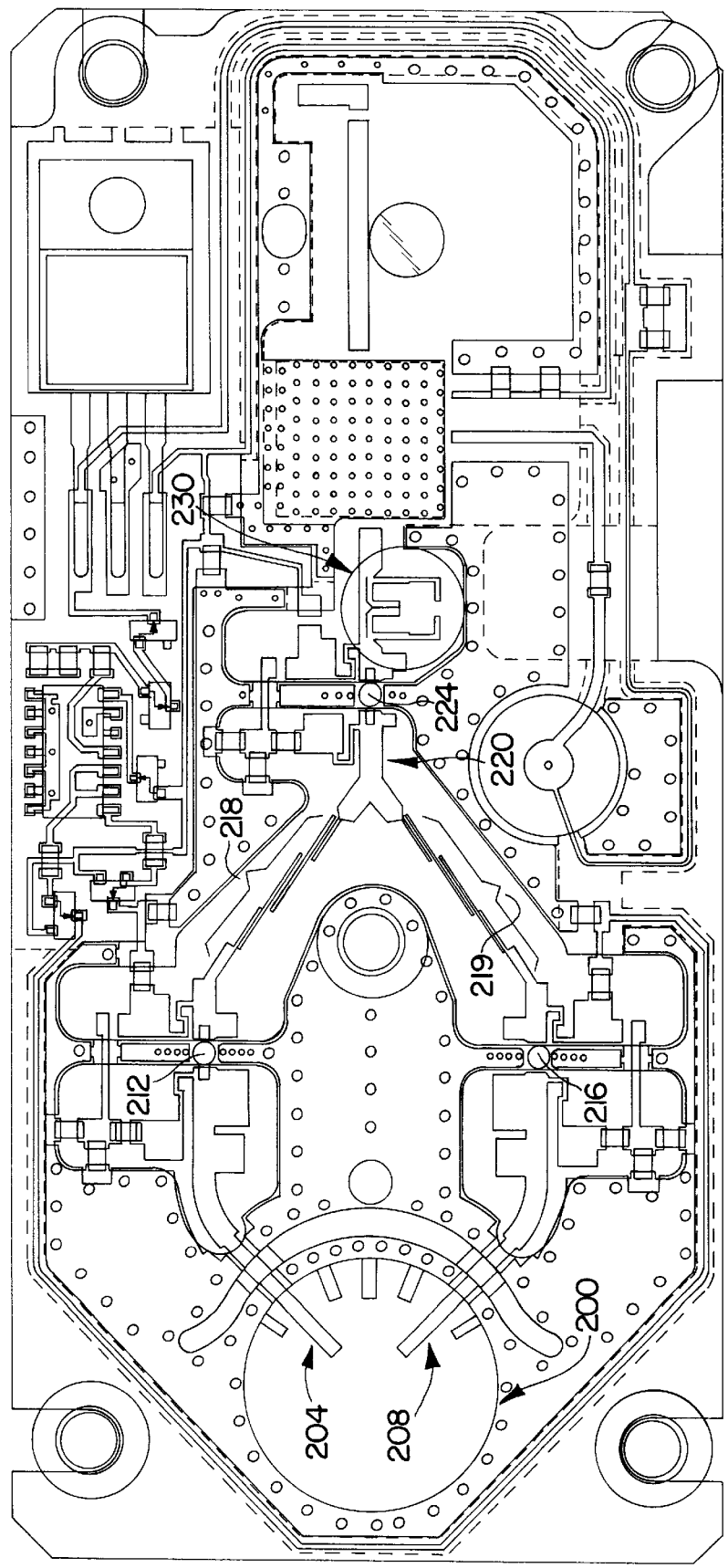
FIG. 2 is a circuit board drawing depicting an implementation of a DBS low noise block downconverter system using an elliptic high pass filter.

FIG. 2 is a circuit board in which the elliptic high pass filter has been incorporated in a low noise block downconverter for a DBS. FIG. 2 shows a waveguide transition 200 connected to a first electric probe 204 and a second electric probe 208. The separate channels of the two probes feed separate low noise amplifiers. The first electric probe 204 channels its portion of the signal to a first LNA 212. The second electric probe 208 channels its portion of the signal to a second LNA 216.

In this particular embodiment of the present invention, edge coupled band pass filters are used immediately after the LNA amplifiers. The first edge coupled band pass filter 218 filters the signal from the first LNA block 212. The second edge coupled band pass filter 219 filters the signal from the second LNA block 216. The purpose of the edge coupled band pass filters provides the functionality related to the combining of signals in LNBs.

The edge coupled band pass filters feed their respective signals into the power combiner 220. The power combiner is connected to the second stage LNA 224. The second stage LNA is connected to the elliptic high pass filter 230. The elliptic high pass filter 230 filters the image frequencies which are 1 GHz below the frequency of the local oscillator.

FIG. 2 provides a comparison between the size of an edge coupled filter and an elliptic filter. For example, the first edge coupled band pass filter 218 is much longer and accordingly assumes a greater amount of area on the circuit board than the elliptic high pass filter 230 and consequently acquires higher manufacturing costs.

Figure 3:
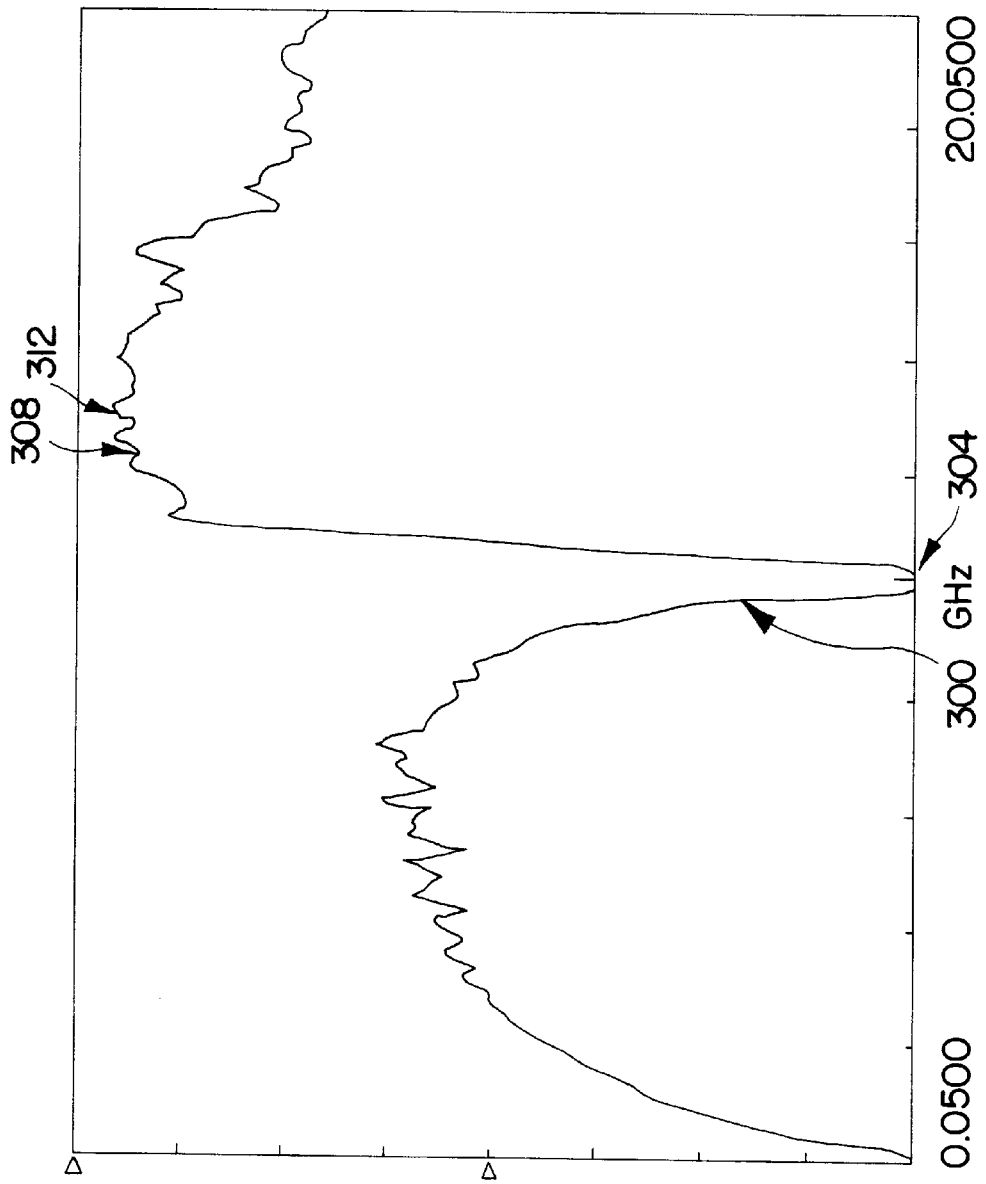
FIG. 3 is a graph showing the transmission response of the elliptic filter as used within the present invention.

FIG. 3 is a graph showing the transmission response of the elliptic high pass filter. The X-axis represents the frequency of the elliptic high pass filter ranging from 0.05 GHz to 20.05 GHz. The Y-axis is the transmission loss expressed in decibels (dB) ranging from 0 dB to −40 dB. The portion of the curve from position 300 to position 304 represent the image band portion of the Ku-band United States DBS. The portion of the graph from position 308 to position 312 represent the desired frequencies to be passed to the HEMT MMIC downconverter. The coordinate values of position 300 are 9.77 GHz and −31.6 dB. The coordinate values for position 304 are 10.25 GHz and −52.4 dB. The coordinate values for position 308 are 12.17 GHz and −3 dB. The coordinate values for position 312 are 12.77 GHz and −2.7 dB. Lastly, the "notch" at position 304 is the finite transmission zero near to the pass band. This characteristic of the elliptic filter achieves optimum filter size and minimal insertion losses with maximum image band rejection.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

It is claimed:

1. A method for rejecting image frequencies from frequency modulated signals received from an antenna for use in a low noise block downconverter of a radio frequency receiving system, comprising the steps of:

low noise amplifying said received frequency modulated signals;

using a high pass elliptic filter to pass high pass frequency signals while rejecting said image frequencies from said received frequency modulated signals;

amplifying said high pass signals of said elliptic filter;

filtering said amplified high pass signal with a band pass filter;

generating local oscillation signals at a predefined frequency; and mixing said local oscillation signals and said high pass signals from said elliptic filter to generate intermediate frequency signals.

2. The method of claim 1 wherein said radio frequency receiving system is a satellite receiving system.

3. The method of claim 1 wherein said image frequencies are at a frequency of approximately 10.25 GHz and wherein said predefined frequency is at a frequency of approximately 11.25 GHz.

4. The method of claim 1 wherein said received frequency modulated signals have a frequency of 12.2–12.75 GHz.

5. The method of claim 1 wherein said intermediate frequency signals have a frequency of 0.95–1.5 GHz.

6. The method of claim 1 further comprising the steps of:

detecting said received frequency modulated signals from said antenna via a waveguide transition;

transmitting said received frequency modulated signals from said waveguide transition via first and second electric plane probes for said low noise amplifying of said received frequency modulated signals, said received frequency modulated signals containing a first and second channel, said first probe conducting said first channel, said second probe conducting said second channel;

low noise amplifying said first channel with a first low noise amplifier;

low noise amplifying said second channel with a second low noise amplifier;

switching between said low noise amplified first channel and said low noise amplified second channel for conducting said low noise amplified first and second channels to said elliptic filter; and amplifying said intermediate frequency signals.

7. A low noise block downconverter used in a radio frequency receiving system for rejecting image frequencies from frequency modulated signals received from an antenna, comprising:

a first low noise amplification stage having at least one low noise amplifier coupled to said antenna for low noise-amplifying of said received frequency modulated signals;

a high pass elliptic filter coupled to said first low noise amplification stage for passing high pass frequency signals while rejecting said image frequencies from said received frequency modulated signals;

a radio-frequency amplifier stage coupled to said elliptic filter for amplifying said high pass signals of said elliptic filter;

a local oscillator for generating local oscillation signals at a predefined frequency;

a mixer coupled to said local oscillator and to said high pass elliptic filter for mixing said local oscillation signals and said high pass frequency signals from said elliptic filter to generate intermediate frequency signals; and a band pass filter coupled to said radio-frequency amplifier stage and to said mixer for filtering said amplified high pass signals and for providing said filtered high pass signals to said mixer.

8. The low noise block downconverter of claim 7 wherein said radio frequency receiving system is a satellite receiving system.

9. The low noise block downconverter of claim 7 wherein said image frequencies are at a frequency of approximately 10.25 GHz.

10. The low noise block downconverter of claim 7 wherein said predefined frequency is at a frequency of approximately 11.25 GHz.

11. The low noise block downconverter of claim 7 wherein said received frequency modulated signals have a frequency of 12.2–12.75 GHz.

12. The low noise block downconverter of claim 7 wherein said intermediate frequency signals have a frequency of 0.95–1.5 GHz.

13. The low noise block downconverter of claim 7 further including a waveguide transition coupled to said antenna for detecting said received frequency modulated signals from said antenna.

14. The low noise block downconverter of claim 13 further including first and second electric plane probes connected to said waveguide transition for conducting said received frequency modulated signals to said first low noise amplification stage, said received frequency modulated signals containing a first and second channel, said first probe conducting said first channel, said second probe conducting said second channel.

15. The low noise block downconverter of claim 14 wherein said first low noise amplification stage includes a first low noise amplifier and a second low noise amplifier, said first low noise amplifier amplifying said first channel, said second low noise amplifier amplifying said second channel.

16. The low noise block downconverter of claim 15 further comprising a power combiner coupled to said first and second low noise amplifiers and to said elliptic filter for switching between said first channel having been low-noise amplified by said first low noise amplifier and said second channel having been low-noise amplified by said second low noise amplifier for transmitting said first and second channel to said elliptic filter.

17. The low noise block downconverter of claim 7 further comprising an intermediate frequency amplifier stage coupled to said mixer for amplifying said intermediate frequency signals.

18. The low noise block downconverter of claim 7 wherein said local oscillator and said mixer are implemented on a high electron mobility transistor monolithic microwave/millimeter wave integrated circuit.

* * * * *